(12) United States Patent
Kawakita et al.

(10) Patent No.: US 8,472,492 B2
(45) Date of Patent: Jun. 25, 2013

(54) VERTICAL CAVITY SURFACE EMITTING LASER ELEMENT, VERTICAL CAVITY SURFACE EMITTING LASER ARRAY ELEMENT, VERTICAL CAVITY SURFACE EMITTING LASER DEVICE, LIGHT SOURCE DEVICE, AND OPTICAL MODULE

(75) Inventors: Yasumasa Kawakita, Tokyo (JP);
Takeo Kageyama, Tokyo (JP); Hitoshi Shimizu, Tokyo (JP); Hirotatsu Ishii, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 548 days.

(21) Appl. No.: 12/726,668

(22) Filed: Mar. 18, 2010

(65) Prior Publication Data
US 2010/0271690 A1 Oct. 28, 2010

(30) Foreign Application Priority Data

Mar. 27, 2009 (JP) .................................. 2009-079665
Dec. 8, 2009 (JP) .................................. 2009-278750

(51) Int. Cl.
*H01S 5/00* (2006.01)

(52) U.S. Cl.
USPC ......................................... 372/50.11; 359/344

(58) Field of Classification Search
USPC ......................................... 372/50.11; 359/344
See application file for complete search history.

(56) References Cited

U.S. PATENT DOCUMENTS

| 5,557,627 | A * | 9/1996 | Schneider et al. | 372/50.12 |
| 6,317,443 | B1 * | 11/2001 | Craig et al. | 372/38.04 |
| 6,586,875 | B1 * | 7/2003 | Chen et al. | 313/506 |
| 7,778,297 | B2 | 8/2010 | Kageyama et al. | |
| 2007/0030874 | A1 * | 2/2007 | Ariga et al. | 372/50.124 |
| 2008/0240192 | A1 | 10/2008 | Kageyama et al. | |

FOREIGN PATENT DOCUMENTS

| JP | 06-196821 | 7/1994 |
| JP | 2002-100834 | 4/2002 |
| JP | 2005-252111 | 9/2005 |

OTHER PUBLICATIONS

V. Swaminathan et al, "Temperature and Orientation Dependence of Plastic Deformation in GaAs Single Crystals Doped With Si, Cr, or Zn", J. Am. Ceram. Soc., 58, 1975, p. 482.

M. A. Afromowitz, "Thermal Conductivity of $Ga_{1-x}Al_xAs$ Alloys", J. Appl. Phys. vol. 44, No. 3, Mar. 1973, p. 1292.

T. Ninomiya, "Velocities and Internal Friction of Disclocations in III-V Compounds", J. de Phyique, C6 Colloq, Jun. 1979, p. C6-143.

* cited by examiner

*Primary Examiner* — Eric Bolda
(74) *Attorney, Agent, or Firm* — Oblon, Spivak, McClelland, Maier & Neustadt, L.L.P.

(57) ABSTRACT

Included are: an active layer provided between an upper multilayer film reflecting mirror and a lower multilayer film reflecting mirror formed on a GaAs substrate and formed of a periodic structure of a low-refractive-index layer formed of $Al_xGa_{1-x}As$ ($0.8 \leq x \leq 1$) and a high-refractive-index layer formed of $Al_yGa_{1-y}As$ ($0 \leq y \leq x$), at least one of the low-refractive-index layer and the high-refractive-index layer being of n-type; and a lower electrode provided between the lower multilayer film reflecting mirror and the active layer and configured to inject an electric current into the active layer.

11 Claims, 8 Drawing Sheets

VERTICAL CAVITY SURFACE EMITTING LASER ELEMENT, VERTICAL CAVITY SURFACE EMITTING LASER ARRAY ELEMENT, VERTICAL CAVITY SURFACE EMITTING LASER DEVICE, LIGHT SOURCE DEVICE, AND OPTICAL MODULE

CROSS-REFERENCE TO RELATED APPLICATIONS

This application is based upon and claims the benefit of priority from Japanese Patent Application No. 2009-079665, filed on Mar. 27, 2009, and Japanese Patent Application No. 2009-278750, filed on Dec. 8, 2009; the entire contents of which are incorporated herein by reference.

BACKGROUND OF THE INVENTION

1. Field of the Invention

The present invention relates to a vertical cavity surface emitting laser element, a vertical cavity surface emitting laser array element, a vertical cavity surface emitting laser device, a light source device, and an optical module.

2. Description of the Related Art

Vertical cavity surface emitting lasers (VCSEL: vertical cavity surface emitting laser is hereinafter referred to as "surface emitting laser element") are used as light sources for various optical communications including optical interconnections, or other various devices for applications (for example, see Japanese Patent Application Laid-open No. 2005-252111). Because surface emitting laser elements emit laser beams vertically to substrates, a plurality of elements are able to be two-dimensionally arrayed on the same substrate more easily than conventional edge emitting laser elements. Moreover, they have many advantages because the volumes of active layers are very small, like laser emissions with extremely low threshold currents and low electric power consumptions being possible. Such a surface emitting laser element uses a distributed Bragg reflector (DBR) mirror, which is formed of a periodic structure of low-refractive-index layers and high-refractive-index layers and which is a mirror constituting a cavity.

When a DBR mirror is stacked on a substrate, there is a problem that dislocation occurs due to lattice mismatch between the substrate and the DBR mirror, and the surface emitting laser element becomes less reliable or defective. That is, because the layer thickness of the DBR mirror is thick, strain accumulates in the DBR mirror due to the lattice mismatch. As the DBR mirror becomes thicker, crystal defects aggregate and form a dislocation network. This is generally observed as linear dislocation (cross-hatches), and is a cause of a defect if introduced into an active layer of the surface emitting laser element. Particularly, cross-hatches extremely decrease the manufacturing yield for an array element. This is because the cross-hatches pass straight through each active layer of the array element.

To reduce this dislocation, conventionally, a surface emitting laser element that employs a substrate added with indium (In) to reduce a warp of the substrate and decrease the occurrence of dislocation (see, Japanese Patent Application Laid-open No. 2005-252111); and a surface emitting laser element, in which a lattice constant of a multi-element mixed crystal such as AlGaAsP or AlGaInP, which is a semiconductor material constituting a DBR mirror, is made close to that of a GaAs substrate to maintain lattice match and reduce dislocation (see, Japanese Patent Application Laid-open No. 2002-100834, and Japanese Patent Application Laid-open No. H6-196821), have been proposed.

Thermal impedances of DBR mirrors in surface emitting laser elements are desirably made low. Making the thermal impedance of a DBR mirror low have advantageous like its reliability being improved because of suppression of a temperature rise in the active layer; a roll-over current value being increased, which is advantageous when performing high frequency modulation; and the stability of emission wavelength being improved because of decrease in temperature dependency of reflected wavelength characteristics and the like.

As a method of making the thermal impedance of a DBR mirror low, there is a method of forming a DBR mirror with a semiconductor material having a high composition of aluminum (Al), which has high thermal conductivity, like AlGaAs having an Al composition of 0.8 or higher.

However, AlGaAs with a high Al composition has a lattice strain of approximately 0.14% for example, with respect to GaAs, and thus there is a problem that when the Al composition is increased in a DBR mirror made of AlGaAs formed on a GaAs substrate, cross-hatches generated on the surface are increased.

Moreover, conventional techniques for reducing the dislocation have the following problems. That is, in a technique of adding In to a substrate, it is technically very difficult to add In uniformly. In a technique of forming a DBR mirror with a multi-element mixed crystal material, it is not possible to make the Al composition high because of the multiple elements. In other words, it has been difficult to simultaneously make the thermal impedances and dislocation in BR mirrors low.

SUMMARY OF THE INVENTION

It is an object of the present invention to at least solve the above problems.

A surface emitting laser element according to an embodiment of the present invention includes: a substrate made of GaAs; a lower multilayer film reflecting mirror formed on the substrate and formed of a periodic structure of a low-refractive-index layer made of $Al_xGa_{1-x}As$, where $0.8 \leq x \leq 1$, and a high-refractive-index layer formed of $Al_yGa_{1-y}As$, where $0 \leq y \leq x$, at least one of the low-refractive-index layer and the high-refractive-index layer being of n-type; an upper multilayer film reflecting mirror provided above the lower multilayer film reflecting mirror, and formed of a periodic structure of a low-refractive-index layer and a high-refractive-index layer; an active layer provided between the lower multilayer film reflecting mirror and the upper multilayer film reflecting mirror; and a lower electrode provided at least between the lower multilayer film reflecting mirror and the active layer, and configured to inject an electric current into the active layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments of a vertical cavity surface emitting laser element, a vertical cavity surface emitting laser array element, a vertical cavity surface emitting laser device, a light source device, and an optical module according to the present invention will be explained below in detail with reference to the drawings in FIGS. 1 to 15. However, the present invention is not limited by the embodiments, and various modifications of the embodiments are possible within a scope not departing from the outline of the present invention.

(First Embodiment)

Figure 1:
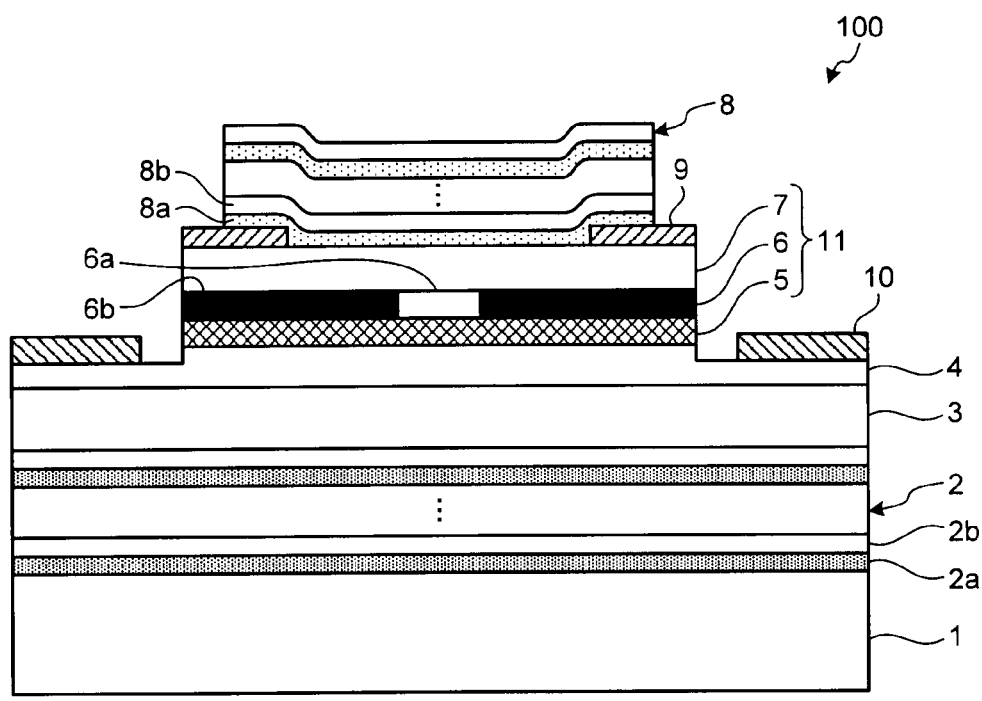
FIG. 1 is a schematic cross-sectional view of a surface emitting laser element according to a first embodiment.

FIG. 1 is a schematic cross-sectional view of a surface emitting laser element 100 according to a first embodiment of the present invention. As depicted in FIG. 1, the surface emitting laser element 100 includes, a lower DBR mirror 2 that is undoped and laminated on a GaAs substrate 1, a separation layer 3, an n-type cladding layer 4, an active layer 5, a current confining layer 6, a p-type cladding layer 7, an upper DBR mirror 8, a p-side electrode 9, and an n-side electrode 10. Among these, a top portion of the n-type cladding layer 4, the active layer 5 laminated on the n-type cladding layer 4, the current confining layer 6, and the p-type cladding layer 7 are formed as a mesa post 11 that is column-shaped by, for example, an etching process.

The lower DBR mirror 2 is formed as a semiconductor multilayer film mirror in which a plurality of combined semiconductor layers each made of AlAs/GaAs formed of a low-refractive-index layer 2a made of AlAs and a high-refractive-index layer 2b made of GaAs that are combined together are laminated. The thickness of each layer forming the combined semiconductor layers is $\lambda/4n$ ($\lambda$: emission wavelength; n: refractive index). The lower DBR mirror 2 is added with silicon (Si), which is an n-type dopant, and has n-type conductivity.

The upper DBR mirror 8 is formed as a dielectric multilayer film mirror in which a plurality of combined dielectric layers each made for example of SiN/SiO$_2$ formed of a low-refractive-index layer 8a made of SiO$_2$ and a high-refractive-index layer 8b made of SiN that are combined together are laminated, and the thickness of each layer is $\lambda/4n$ like that of the lower DBR mirror 2.

The current confining layer 6 includes an opening 6a and a selectively oxidized layer 6b. The current confining layer 6 is formed of an Al-containing layer made of AlAs for example. The selectively oxidized layer 6b is formed in a ring-belt as the Al-containing layer is oxidized only within a certain area from an outer periphery along a lamination plane. The opening 6a is formed as a layer that is not oxidized. The selectively oxidized layer 6b is insulative, and increases a current density in the active layer 5 immediately below the opening 6a by confining a current injected from the p-side electrode 9 and concentrating the current into the opening 6a.

The active layer 5 has a quantum well structure of three of layers formed of, for example, GaInNAs/GaAs, and emits spontaneous emission light based on a current injected from the p-side electrode 9 and confined by the current confining layer 6. The spontaneous emission light is laser-emitted, for example, at a wavelength of 1270 nm in a 1.3 µm band, by amplification due to stimulated emission by the active layer 5 and a cavity formed of the lower DBR mirror 2 and the upper DBR mirror 8. As a result, a laser beam is emitted from the upper surface of the upper DBR mirror 8.

The p-side electrode 9 is laminated on the p-type cladding layer 7 made of p-GaAs, and formed in a ring. The n-side electrode 10 that is a lower electrode is laminated on the n-type cladding layer 4 made of n-GaAs, and formed C-shaped so as to surround a bottom surface portion of the mesa post 11 along the lamination plane. In other words, the n-type cladding layer 4 also plays the role of a contact layer to the n-side electrode 10. The p-side electrode 9 and the n-side electrode 10 are electrically connected to an external circuit (like a current supply circuit) with a p-side drawn-out electrode and an n-side drawn-out electrode, respectively.

The separation layer 3 is made of undoped GaAs, and electrically separates the lower DBR mirror 2 and the n-type cladding layer 4.

As described above, in the surface emitting laser element 100, the p-side electrode 9 and the n-side electrode 10 are positioned above the lower DBR mirror 2. The surface emitting laser element 100 has a so-called intra-cavity contact structure in which a current injecting structure formed of the n-type cladding layer 4, the current confining layer 6, the p-type cladding layer 7, the p-side electrode 9, and the n-side electrode 10 is positioned inside the cavity formed of the lower DBR mirror 2 and the upper DBR mirror 8.

When manufacturing the surface emitting laser element 100, at first, using a MOCVD (metal organic chemical vapor deposition) method for example, the lower DBR mirror 2, the separation layer 3, the n-type cladding layer 4, the active layer 5, an AlAs layer for forming the current confining layer 6, and the p-type cladding layer 7 are epitaxially grown one after another on the substrate 1 of three inches (76.2 mm) in diameter for example.

Patterning of the mesa post 11 is then performed by photolithography, and etching up to a depth reaching the n-type cladding layer 4 is performed, to form multiple mesa posts 11. After that, oxidization is performed at approximately 400° C. on the lamination structure that has been processed into the mesa posts 11 in an atmosphere of steam, thereby selectively oxidizing an outer peripheral region of the AlAs layer in the mesa post 11. Through the selective oxidization, an outer peripheral region of 10 μm in width is oxidized for example, and becomes the selectively oxidized layer 6b, and a region left in the center made of AlAs becomes the opening 6a, to form the current confining layer 6. After that, the p-side electrode 9 and the n-side electrode 10 are formed, the upper DBR mirror 8 is formed, element-dividing into each surface emitting laser element 100 is performed, and the surface emitting laser element 100 is completed.

In the surface emitting laser element 100, the low-refractive-index layer 2a of the lower DBR mirror 2 has a low thermal impedance because the low-refractive-index layer 2a is made of AlAs having a high Al composition of 1. Because the Al composition of the low-refractive-index layer 2a is high, the lower DBR mirror 2 has a large lattice mismatch with the substrate 1. However, in the surface emitting laser element 100, the lower DBR mirror 2 is of the n-type by being added with Si, and thus has a high yield stress. As a result, even if misfit dislocation due to lattice mismatch occurs between the substrate 1 and the lower DBR mirror 2, penetration of the misfit dislocation to the surface of the lower DBR mirror 2 is suppressed, and the dislocation is small.

This is specifically explained below. In surface emitting laser elements of a conventional intra-cavity contact structure, substrates and lower DBR mirrors to be formed on the substrate are undoped, to ensure insulation.

Figure 2:
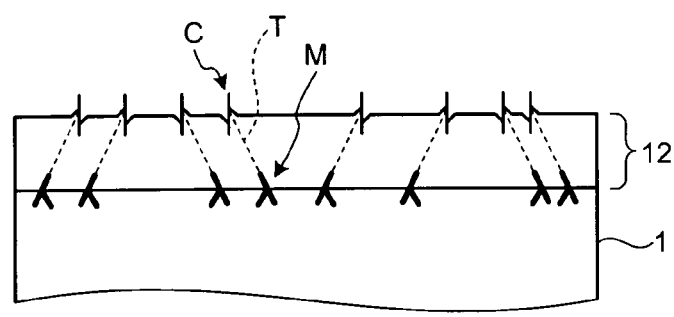
FIG. 2 is a schematic diagram for explaining a mechanism by which dislocation occurs in a conventional surface emitting laser element.

FIG. 2 is a schematic diagram for explaining a mechanism by which a dislocation occurs in a conventional surface emitting laser element. As depicted in FIG. 2, when growing the lower DBR mirror 12 that is undoped on the GaAs substrate 1 that is undoped, a warp is produced due to lattice mismatch between the GaAs substrate 1 and the lower DBR mirror 12; when the warp accumulates to a certain extent in a growing layer, a point dislocation occurs; and when the warp further increases, a misfit dislocation M occurs, extends through the lower DBR mirror 12 as a penetration dislocation T, and appears on the surface of the lower DBR mirror 12 as a cross-hatch C.

Figure 3:
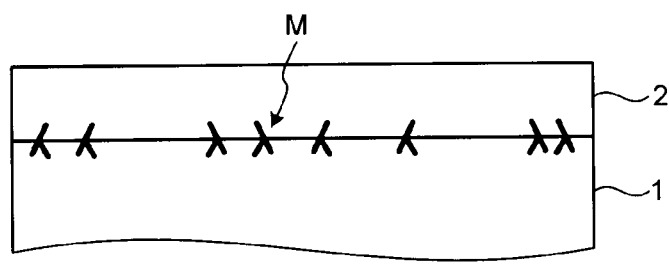
FIG. 3 is a schematic diagram for explaining a mechanism by which the occurrence of dislocation is suppressed in the surface emitting laser element depicted in FIG. 1.

In contrast, FIG. 3 is a schematic diagram for explaining a mechanism by which the occurrence of dislocation is suppressed in the surface emitting laser element 100 depicted in FIG. 1. As depicted in FIG. 3, in the surface emitting laser element 100, the lower DBR mirror 2 is of n-type by being added with Si, and thus its yield stress is high, and its crystal is hardened (see, V. Swaminathan et al., "Temperature and Orientation Dependence of Plastic Deformation in GaAs Single Crystals Doped with Si, Cr, or Zn", J. Am. Ceram. Soc., 58 (1975) 482.). As a result, penetration of the misfit dislocation M to the surface of the lower DBR mirror 2 is suppressed, so that cross-hatches are not generated or cross-hatches are decreased on the surface, resulting in low dislocation.

In other words, because the occurrence of misfit dislocation M is determined by lattice mismatch between the substrate 1 and the lower DBR mirror 2, it is difficult to suppress the occurrence. In contrast, according to the surface emitting laser element 100, the extent to which the misfit dislocation M becomes a problem as a cross-hatch is decreased by hardening the lower DBR mirror 2.

Because the lower DBR mirror 2 is of the n-type as described above, in the surface emitting laser element 100, electrical separation between the lower DBR mirror 2 and the current injecting structure for the active layer 5 is achieved by inserting the separation layer 3 between the lower DBR mirror 2 and the n-type cladding layer 4, to achieve a low volume.

According to the above embodiment, the lower DBR mirror 2 is formed by combining the low-refractive-index layer 2a made of AlAs and the high-refractive-index layer 2b made of GaAs, but the lower DBR mirror 2 may be any combination of a low-refractive-index layer made of $Al_xGa_{1-x}As$ ($0.8 \leq x \leq 1$), and a high-refractive-index layer made of $Al_yGa_{1-y}As$ ($0 \leq y \leq x$). According to M. A. Afromowitz, "Thermal conductivity of $Ga_{1-x}Al_xAs$ alloys", J. Appl. Phys., 44 (1973) 1292, the thermal conductivity of $Al_xGa_{1-x}As$ at 300 K (Kelvins) is expressed using Al composition x as follows: $0.55 - 2.12 x + 2.48 x^2$. Accordingly, when the Al composition x is 0.855, the thermal conductivity of $Al_xGa_{1-x}As$ is approximately 0.55 W / (cm·K), to be equal to that of GaAs having x of zero. For this reason, in order to make the thermal conductivity high, the low-refractive-index layer of the lower DBR mirror 2 is preferably $Al_xGa_{1-x}As$ that satisfies $0.855 < x$. The Al composition y of the high-refractive-index layer is set within the range $0 \leq y \leq x$ so as to have a higher refractive index than the low-refractive-index layer. The number of pairs in the lower DBR mirror 2 is appropriately determined in accordance with a refractive index difference between the high-refractive-index layer and the low-refractive-index layer, and a reflectance to be achieved by the lower DBR mirror 2 (for example, 99% or more).

Moreover, according to the above embodiment, although Si is used as an n-type dopant for the lower DBR mirror, the n-type dopant is not particularly limited, and for example, tellurium (Te), sulfur (S), selenium (Sc), tin (Sn), germanium (Ge), or any combination thereof may be used. The lower DBR mirror may not be added with an n-type dopant as long as it has an n-type conductivity with an n-type carrier concentration of $5 \times 10^{17}$ cm$^{-3}$ or higher.

T. Ninomiya, "Velocities and internal friction of dislocations in III-V compounds", J. de Phyique, C6 Colloq (1979) C6-143, for example suggests that the speed of dislocation in GaAs crystals decreases independently of the type of the dopant and correspondingly with an increase in the n-type carrier concentration. Along with the decrease in the speed of dislocation, the yield stress of GaAs crystals is considered to become high. From investigations by the present inventors, it was found that not only in GaAs crystals but also in AlAs crystals and AlGaAs crystals, there was a similar effect of a rise in yield stress. Therefore, the lower DBR mirror according to the present invention provides the effect as long as it is of the n-type by adding an n-type dopant for example.

Furthermore, according to the above embodiment, although the low-refractive-index layer 2a and the high-refractive-index layer 2b of the lower DBR mirror 2 are both added with Si and are of the n-type, at least one layer of the low-refractive-index layer 2a and the high-refractive-index layer may be of the n-type so as to make an average of the n-type carrier concentration in the lower DBR mirror 2 equal to or higher than $5 \times 10^{17}$ cm$^{-3}$. In other words, when at lease one layer of the low-refractive-index layers 2a forming the lower DBR mirror 2 is of the n-type, the rest of the low-refractive-index layers 2a and the high-refractive-index layers 2b may be of the i-type; or when at least one layer of the high-refractive-index layers 2b is of the n-type, the rest of the high-refractive-index layers 2b and the low-refractive-index layers 2a may be of the i-type. As described above, the low-refractive-index layer has a higher Al composition than the high-refractive-index layer, and its lattice warp is larger. Therefore, a mirror in which at least its low-refractive-index layer is of the n-type, and its high-refractive-index layer has a lower carrier concentration than the low-refractive-index layer, may be used as the lower DBR mirror. In such a case, as the high-refractive-index layer, a layer having a low concentration of an added n-type dopant or a layer that is non-doped may be employed.

Moreover, according to the above embodiment, although the separation layer 3 is inserted between the lower DBR mirror 2 and the n-type cladding layer 4, it may be inserted into any position between the substrate 1 and the n-type cladding layer 4. The separation layer 3 is not necessarily formed, and when it is not formed, to achieve electrical separation between the substrate 1 and the n-side electrode 10, a low-refractive-index layer or a high-refractive-index layer coming in contact with the n-type cladding layer 4 side of the lower DBR mirror 2 is preferably a non-doped layer.

To explain the present invention more specifically, relation between the lower DBR mirror added with Si and a warp occurring in the substrate is explained below.

First of all, an average intra-layer strain of the lower DBR mirror is defined. An average intra-layer strain $\epsilon_{ave}$ is defined as an average strain of a high-refractive-index layer and a low-refractive-index layer made of AlGaAs forming the lower DBR mirror with respect to the substrate, as in Equation (2) below:

$$\varepsilon_{ave} = \left( \frac{a_h - a_{sub}}{a_{sub}} \times t_h(\lambda) + \frac{a_l - a_{sub}}{a_{sub}} \times t_l(\lambda) \right) \bigg/ [t_h(\lambda) + t_l(\lambda)] \quad (2)$$

In Equation (2), $a_h$ denotes a lattice constant of the high-refractive-index layer, $a_l$ denotes a lattice constant of the low-refractive-index layer, $a_{sub}$ denotes a lattice constant of the substrate (5.6533 angstroms in a case of GaAs), $t_h(\lambda)$ denotes the $\lambda/4n$ layer thickness of the high-refractive-index layer, and $t_l(\lambda)$ denotes the $\lambda/4n$ layer thickness of the low-refractive-index layer. These are in angstroms. In addition, $\lambda$ denotes a reflection center wavelength of the lower DBR mirror in nanometers (nm).

The lattice constants $a_h$ and $a_l$ vary as expressed below in Equation (3) and Equation (4) in accordance with the Si-added concentrations, $n_h$ and $n_l$, and the Al compositions, $x_h$ and $x_l$, respectively.

$$a_h = 5.6533 + (7.85 \times 10^{-3})x_h - (7.227 \times 10^{-23})n_h \quad (3)$$

$$a_l = 5.6611 - (7.85 \times 10^{-3})(1-x_l) - (7.257 \times 10^{-23})n_l \quad (4)$$

Substituting Equation (3) and Equation (4) into Equation (2), the average intra-layer strain $\epsilon_{ave}$ is expressed as in Equation (5) below.

$$\varepsilon_{ave} = \left[ \frac{(7.85 \times 10^{-3})x_h - (7.227 \times 10^{-23})n_h}{5.6533} t_h(\lambda) + \frac{(7.85 \times 10^{-3})x_l - (7.257 \times 10^{-23})n_l}{5.6533} t_l(\lambda) \right] \bigg/ [t_h(\lambda) + t_l(\lambda)] =$$

$$\frac{(7.85 \times 10^{-3})[x_h \cdot t_h(\lambda) + x_l \cdot t_l(\lambda)] - (7.227 \times 10^{-23})n_h \cdot t_h(\lambda) - (7.257 \times 10^{-23})n_l \cdot t_l(\lambda)}{5.6533[t_h(\lambda) + t_l(\lambda)]} \quad (5)$$

When an average Al composition and an average addition concentration in the lower DBR mirror layer are denoted by $x_{ave}$ and $n_{ave}$, the average intra-layer strain $\epsilon_{ave}$ is expressed as in Equation (6) below.

$$\epsilon_{ave} = (1.389 \times 10^{-3})x_{ave} - (1.281 \times 10^{-23})n_{ave} \quad (6)$$

The warp δ of the substrate is considered next. When cross-hatches are not generated, an average intra-layer strain in the lower DBR mirror layer is converted into a warp of the substrate and thus the warp of the substrate is expressed as a quantity proportional to the average intra-layer strain.

The present inventors laminated lower DBR mirrors made of AlAs/GaAs, which have different average Si-added concentrations, on GaAs substrates having various diameters (2 to 3 inches) and thicknesses (450 to 625 µm), measured warps of the substrates generated therein, and observed cross-hatches that appeared on the surfaces.

A case of using a GaAs substrate of three inches in diameter and 450 µm in thickness in which a warp occurred most remarkably is specifically explained below. To begin with, on this GaAs substrate, setting λ to 1270 nm, 30 pairs of the lower DBR mirrors made of AlAs/GaAs added with Si were laminated. In this case, the layer thickness of the AlAs layer was 108.3 nm that was a λ/4n layer thickness, and the layer thickness of the GaAs layer was 91.93 nm that was a λ/4n layer thickness. Accordingly, $x_{ave}$ =0.5409. Experiments of observing cross-hatches appearing on the surfaces for different average Si-added concentrations were carried out. As a result, when an average addition concentration was small, cross-hatches were observed on the surface, and a warp of the substrate was a substantially constant value of approximately 70 µm. For example, when the average addition concentration was $1 \times 10^{16}$ cm$^{-3}$, the warp was 69.6 µm and the density of cross-hatches was 700/ mm$^2$. However, cross-hatches were no longer observed with an average addition concentration of $1.38 \times 10^{18}$ cm$^{-3}$ as a threshold. Moreover, when the average addition concentration was $2.7 \times 10^{18}$ cm$^{-3}$, cross-hatches were not observed, and the warp of the substrate increased to 86 µm. Next, from this relation between the threshold and the warp, the inventors experimentally obtained a proportional coefficient between the warp δ (µm) and the average intra-layer strain $\epsilon_{ave}$ upon including an effect of a decrease in the lattice constant due to Si, as expressed in Equation (7) below.

$$\delta = 9.666 \times 10^4 \times \epsilon_{ave} \quad (7)$$

Furthermore, based on Equation (7), the warp δ (µm) of the substrate including the wavelength λ, the thickness d (µm) of the substrate, and the diameter D (inches) of the substrate was investigated, and the warp δ (µm) was found to be expressed by Equation (1).

$$\delta = 1.71 \times 10^6 \lambda \times [(1.39 \times 10^{-3})x_{ave} - (1.28 \times 10^{-23})n_{ave}] \times \left(\frac{D}{d}\right)^2 \quad (1)$$

Figure 4:
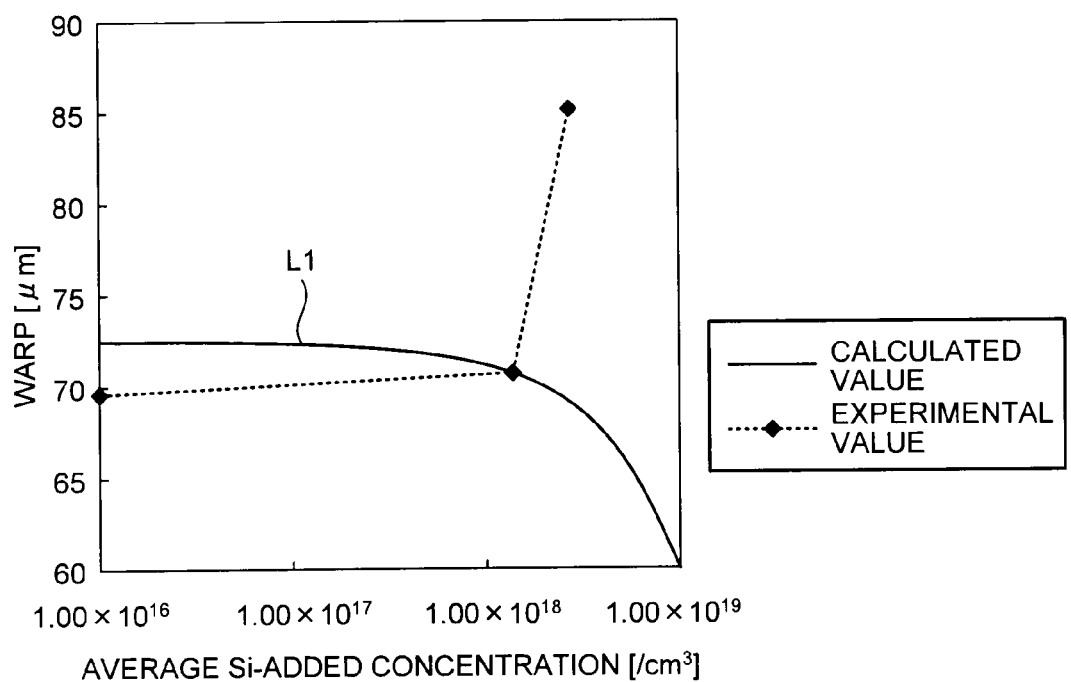
FIG. 4 is a schematic diagram indicating a relationship between an average Si-added concentration in a lower DBR mirror and a warp of a substrate.

FIG. 4 is a schematic diagram illustrating a relationship between an average Si-added concentration in the lower DBR mirror and a warp of the substrate, which was investigated above. In FIG. 4, a broken line and diamond shaped marks represent experimental values, and a line L1 represents calculated values when d=450 µm and D=3 inches in Equation (1). The line L1 expressed by Equation (1) is the threshold at which cross-hatches disappear, and a region including and above the line L1 is a region without cross-hatches. That is, a warp of the substrate is preferably equal to or greater than the warp δ expressed in Equation (1).

Experimental Example 1

To confirm the validity of Equation (1) above, as experimental example 1, in a case where 30 pairs of lower DBR mirrors made of AlAs/GaAs were laminated on a GaAs substrate having a diameter of 3 inches and a thickness of 450 μm, setting λ to 1270 nm; an Si-added concentration in the AlAs layer was $2 \times 10^{18}$ cm$^{-3}$, and an Si-added concentration in the GaAs layer was $1.2 \times 10^{18}$ cm$^{-3}$. A warp of the substrate on which the lower DBR mirrors were laminated was measured to be 70.8 μm. Cross-hatches were not observed on the surface of the lower DBR mirrors.

In this case, $n_{ave}$ is $1.63 \times 10^{18}$ cm$^{-3}$. The layer thickness of the AlAs layer is 108.3 nm, the layer thickness of the GaAs layer is 91.93 nm, and thus $x_{ave}$=0.5409. The warp δ was calculated by Equation (1) using these values, and a value of 70.6 μm was obtained as the warp δ, which was a smaller value than the warp measured in experimental example 1 above. In other words, it was confirmed that occurrence of cross-hatches are able to be avoided under conditions by which a larger warp than the warp δ calculated by Equation (1) is obtained.

Experimental Example 2

As experimental example 2, in a case where 30 pairs of lower DBR mirrors made of $Al_{0.9}Ga_{0.1}As$/GaAs were laminated on a GaAs substrate of three inches in diameter and 450 μm in thickness, setting λ to 1270 nm; an Si-added concentration in the $Al_{0.9}Ga_{0.1}As$ layer was $1 \times 10^{18}$ cm$^{-3}$, and the GaAs layer was undoped. A warp of the substrate on which the lower DBR mirrors were laminated was measured to be 67.1 μm. Cross-hatches were not observed on the surface of the lower DBR mirrors.

In this case, $n_{ave}$ is $5.36 \times 10^{17}$ cm$^{-3}$. The layer thickness of the $Al_{0.9}Ga_{0.1}As$ layer is 106.2 nm that is a λ/4n layer thickness, the layer thickness of the GaAs layer is 91.93 nm, and thus $x_{ave}$=0.4824. The warp δ was calculated by Equation (1) using these values, and a value of 64.1 μm was obtained as the warp δ, which was a smaller value than the warp measured in experimental example 2 above. In other words, it was confirmed that occurrence of cross-hatches are able to be avoided under conditions by which a larger warp than the warp δ calculated by Equation (1) is obtained.

Experimental Example 3

As experimental example 3, in a case where 30 pairs of lower DBR mirrors made of AlAs/GaAs, setting λ to 1270 nm, were laminated on a GaAs substrate of three inches in diameter and 450 μm in thickness; an Si-added concentration in the AlAs layer was $1.2 \times 10^{18}$ cm$^{-3}$, and an Si-added concentration in the GaAs layer was $2.0 \times 10^{13}$ cm$^{-3}$. A warp of the substrate on which the lower DBR mirrors were laminated was measured to be 70.5 μm. Cross-hatches were observed on the surface of the lower DBR mirrors at a density of 36/mm$^2$.

In this case, $n_{ave}$ is $1.56 \times 10^{18}$ cm$^{-3}$. The layer thickness of the AlAs layer is 108.3 nm, the layer thickness of the GaAs layer is 91.93 nm, and thus $x_{ave}$ =0.5409. The warp δ was calculated by Equation (1) using these values, and a value of 70.66 μm was obtained as the warp δ, which was a larger value than the warp measured in experimental example 3 above. In other words, it was confirmed that cross-hatches occur under conditions by which a smaller warp than the warp δ calculated by Equation (1) is obtained. However, according to experimental example 3, as compared with a case where an average Si-added concentration is low, such as at $1 \times 10^{16}$ cm$^{-3}$ as depicted in FIG. 4, the density of cross-hatches becomes lower. It is considered that this is because as the average Si-added concentration is made high, a dislocation speed of dislocation in the crystal is suppressed, and as a result, a yield stress of the lower DBR mirror is increased, and propagation of misfit dislocation at an interface with the substrate and in the lower DBR mirror, in the direction of the surface, is suppressed.

The propagation of dislocation eases accumulated strain, and reduces a warp of the substrate. Therefore, to obtain a larger warp than the warp δ calculated by Equation (1), specifically, addition of an n-type dopant to an extent by which propagation of dislocation is suppressed is effective.

In the above equation, D denotes the diameter of a circular substrate before element-dividing of surface emitting laser elements. For a surface emitting laser element or a substrate formed by dividing for example a circular substrate into ¼, the length of a longest one of lines each extending from one of vertexes of the substrate through its center of gravity to its edge may be used as D.

In the above experiments, although Si was used as an n-type dopant, when another n-type dopant is used, $n_{ave}$ (cm$^{-3}$)) in Equation (1) may be an average addition concentration of the n-type dopant.

According to the above embodiment, although a dielectric multilayer film mirror is used as the upper DBR mirror 8; a semiconductor multilayer film mirror of the p-type may be used as the upper DBR mirror and the p-side electrode may be formed on the upper DBR mirror, to form an intra-cavity contact structure in which the upper DBR mirror is part of the current injecting structure.

Moreover, according to the embodiment described above, although a surface emitting laser element in which the active layer 5 is formed of a GaInNAs material, and the emission wavelength is in a 1.3 μm band is explained as an example; the emission wavelength of the surface emitting laser element and the material that forms the active layer or the like may be appropriately selected. For example, for a surface emitting laser element having an emission wavelength in a band of 650 nm, an AlGaInP material and an InGaAsP material may be selected; for a surface emitting laser element having an emission wavelength in a band of 1 μm, an InGaAs material may be selected; for a surface emitting laser element having an emission wavelength in a band of 1.3 to 1.6 μm, a GaInAsP material, an AlGaInAs material, and a GaInNAsSb material may be selected; and for a surface emitting laser element having an emission wavelength in a band of 850 nm, an AlGaAs material may be selected.

(Second Embodiment)

Figure 5:
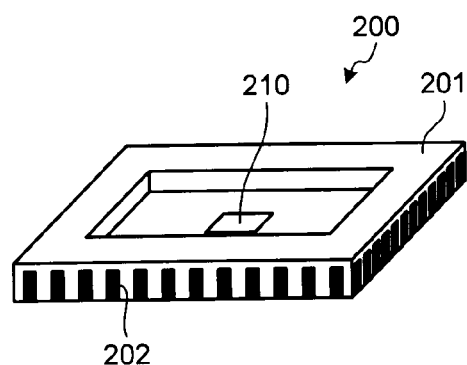
FIG. 5 is a schematic perspective view of a surface emitting laser array device according to a second embodiment.

As a second embodiment of the present invention, a surface emitting laser array device is explained below, which is used in a signal light source for optical interconnection, and which uses the surface emitting laser element according to the present invention. FIG. 5 is a schematic perspective view of the surface emitting laser array device according to the second embodiment. As depicted in FIG. 5, a surface emitting laser array device 200 includes a surface emitting laser array chip 210 mounted on a well-known flat package 201 called ceramic leaded chip carrier (CLCC). The surface emitting laser array chip 210 is connected to metal casters (electrodes) 202 with wirings not illustrated.

Figure 6:
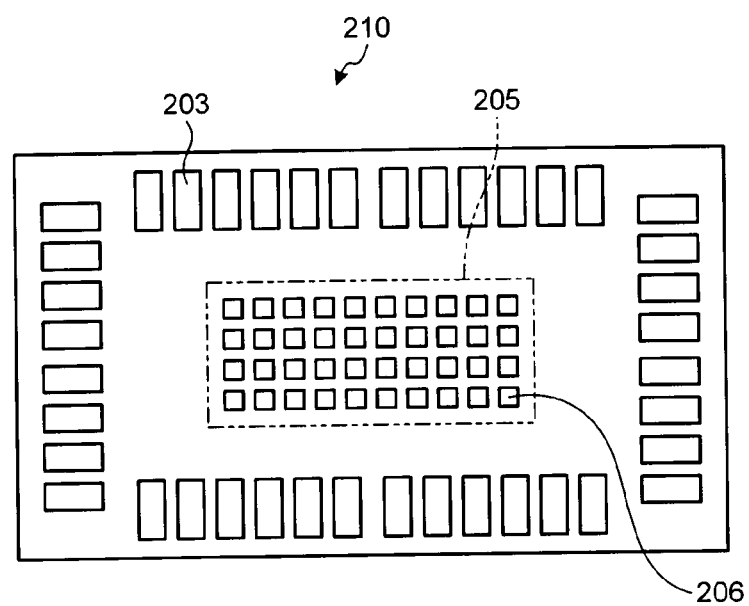
FIG. 6 is a schematic plan view of the surface emitting laser array device depicted in FIG. 5.

FIG. 6 is a schematic plan view of the surface emitting laser array chip 210 depicted in FIG. 5. As depicted in FIG. 6, the surface emitting laser array chip 210 is provided in the center, and includes a surface emitting laser array element unit 205 formed by two-dimensionally arranging a plurality of surface emitting laser elements 206 according to the present invention, and a plurality of electrode pads 203 provided around the surface emitting laser array element unit 205 and connected to respective electrodes of the surface emitting laser elements 206 of the surface emitting laser array element unit 205 with wirings not illustrated. Each of the electrode pads 203 is connected to the metal caster 202 of the flat package 201. The metal caster 202 is electrically connected to an external control circuit (not illustrated) for controlling emission of each of the surface emitting laser elements 206. As the surface emitting laser element 206, the surface emitting laser element 100 according to the first embodiment may be used for example.

Operations of the surface emitting laser array device 200 are explained below. The surface emitting laser elements 206 are supplied with a current including a modulation signal from an external control circuit via the metal casters 202 and the electrode pads 203, and emit laser signal beams of a certain wavelength from respective upper portions thereof.

Because the surface emitting laser array device 200 uses the surface emitting laser elements 206 according to the present invention having a low thermal impedance and low dislocation, the surface emitting laser array device 200 has high reliability, good high-frequency modulation characteristics, high stability of emission wavelength, and high heat radiating ability, and thus it is possible to integrate the elements highly densely. Moreover, particularly, because occurrence of cross-hatches, which is a factor that reduces the manufacturing yield of array elements extremely, is suppressed, the surface emitting laser array device 200 is able to achieve a high manufacturing yield and low cost.

In the surface emitting laser array element unit 205 of the surface emitting laser array device 200, the surface emitting laser elements 206 are two-dimensionally arranged, but the surface emitting laser elements 206 may be arranged one-dimensionally instead.

(Third Embodiment)

Figure 7:
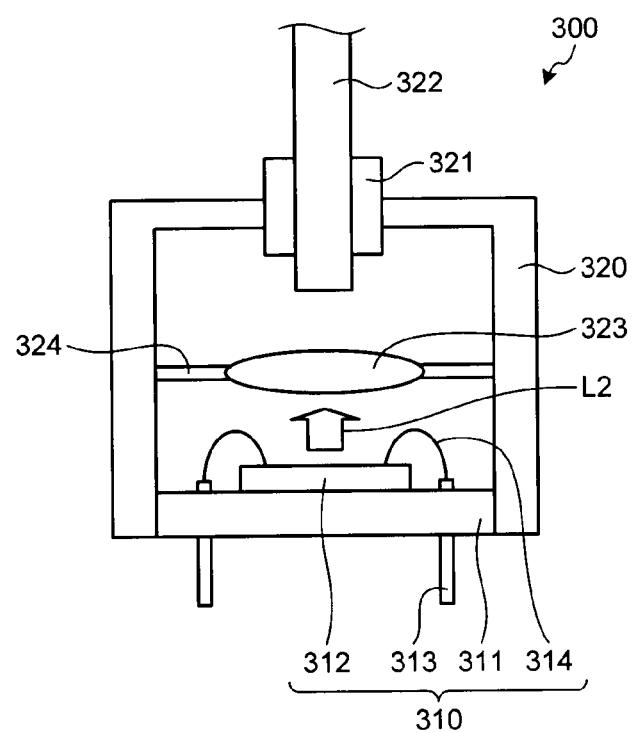
FIG. 7 is a schematic cross-sectional view of a surface emitting laser package according to a third embodiment.

As a third embodiment according to the present invention, a surface emitting laser package is explained below, which is a surface emitting laser device including the surface emitting laser element according to the present invention, and which is used in a signal light source for optical interconnection. FIG. 7 is a schematic cross-sectional view of the surface emitting laser package according to the third embodiment. As depicted in FIG. 7, the surface emitting laser package 300 includes a surface emitting laser element 312 according to the present invention, a substrate 311 on which the surface emitting laser element 312 is mounted, an electrode 313 provided on the substrate 311, a surface emitting laser module 310 including a wire 314 that connects the surface emitting laser element 312 and the electrode 313, a housing 320 that accommodates the surface emitting laser module 310, a lens 323 that is provided above the surface emitting laser module 310 and held in the housing 320 with an arm 324, an optical fiber mount 321 provided at an upper portion of the housing 320, and an optical fiber 322 that is inserted through and held by the optical fiber mount 321. The electrode 313 is electrically connected to an external control circuit (not illustrated) for controlling an emission state of the surface emitting laser module 310. As the surface emitting laser element 312, for example, the surface emitting laser element 100 according to the first embodiment may be used.

Operations of the surface emitting laser package 300 are explained below. The surface emitting laser element 312 is supplied with a current including a modulation signal from the external control circuit via the electrode 313 and the wire 314, and emits a laser signal beam L2 of a certain wavelength, from its upper portion. The lens 323 condenses the laser signal beam L2, and couples it to the optical fiber 322. The optical fiber 322 transmits the coupled laser signal beam L2.

Because the surface emitting laser package 300 uses the surface emitting laser element 312 according to the present invention having a low thermal impedance and low dislocation, the surface emitting laser package 300 has high reliability, good high-frequency modulation characteristics, high stability of emission wavelength, and high heat radiating ability.

(Fourth Embodiment)

Figure 8:
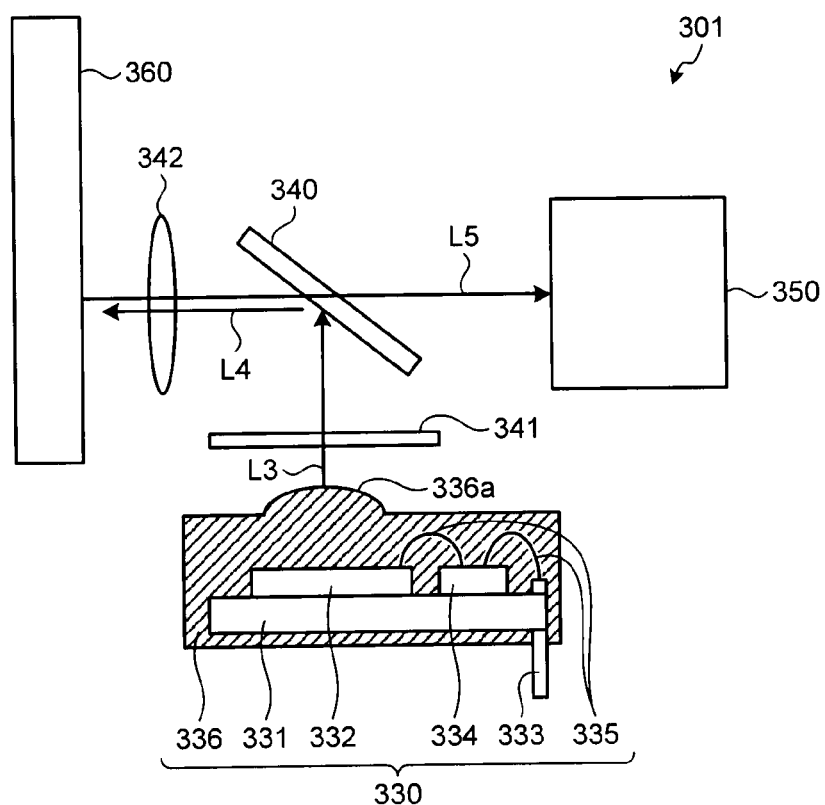
FIG. 8 is a schematic partial cross-sectional view of an optical pickup according to a fourth embodiment.

As a fourth embodiment according to the present invention, an optical pickup is explained below, which is a surface emitting laser device including the surface emitting laser element according to the present invention, and which is used in a writing/reading device for an optical storage medium. FIG. 8 is a partial schematic cross-sectional view of an optical pickup according to the fourth embodiment. As depicted in FIG. 8, an optical pickup 301 includes a surface emitting laser module 330 that includes a surface emitting laser element 332 according to the present invention, a substrate 331 on which the surface emitting laser element 332 is mounted, an electrode 333 provided in the substrate 331, a drive IC 334 mounted on the substrate 331, a wire 335 that connects the surface emitting laser element 332, the drive IC 334, and the electrode 333 one after another, and a resin 336 that seals these elements; a half mirror 340 provided above the surface emitting laser module 330; a diffraction grating 341 provided between the surface emitting laser module 330 and the half mirror 340; a lens 342 provided between the half mirror 340 and an optical storage medium 360; and an optical sensor 350 provided on an opposite side of the optical storage medium 360 with the half mirror 340 between the optical sensor 350 and the optical storage medium 360.

As the surface emitting laser element 332, for example, the surface emitting laser element 100 according to the first embodiment may be used. An upper portion of the resin 336 is processed into a convex, and forms a lens 336a. The electrode 333 is electrically connected to a not-depicted external control circuit (not illustrated) for controlling an emission state of the optical pickup 301.

Operations of the optical pickup 301 are explained below for a case of reading information recorded on the optical storage medium 360. The surface emitting laser element 332 emits a laser beam L3 from its upper portion by the drive IC 334 that is supplied with a current from the external control circuit via the electrode 333 and the wire 335. The lens 336a of the resin 336 collimates the laser beam L3 into a parallel beam (a laser beam L4). The half mirror 340 condenses the laser beam L4 to a certain position on the optical storage medium 360. The laser beam L4 is then reflected by the optical storage medium 360, and a reflected signal beam L5 that includes information recorded on the optical storage medium 360 is generated. The reflected signal beam L5 passes through the lens 342 and the half mirror 340 one after another. The optical sensor 350 then receives the reflected signal beam L5. After that, the optical sensor 350 converts the reflected signal beam L5 into an electric signal, the converted electric signal is transmitted to a personal computer or other equipment connected to the writing/reading device, and reading of recorded information is performed.

The optical pickup 301 uses the surface emitting laser element 332 according to the present invention having a low thermal impedance and low dislocation, and thus has high reliability, good high-frequency modulation characteristics, high stability of emission wavelength, and high heat radiating ability.

Each of the surface emitting laser elements in the third and the fourth embodiments, may be replaced with, for example, the surface emitting laser array device as described in the second embodiment.

Moreover, according to the third and the fourth embodiments, the surface emitting laser element according to the present invention is applied to a surface emitting laser package for communication, or an optical pickup used in a writing/reading device for an optical storage medium. However, the present invention is not limited to this, and may be used as a light source for scanning exposure in a surveying instrument, a laser pointer, an optical instrument such as an optical mouse, a printer, or a photoresist; a light source for laser pumping; or a light source for a machining fiber laser.

(Fifth Embodiment)

Figure 9:
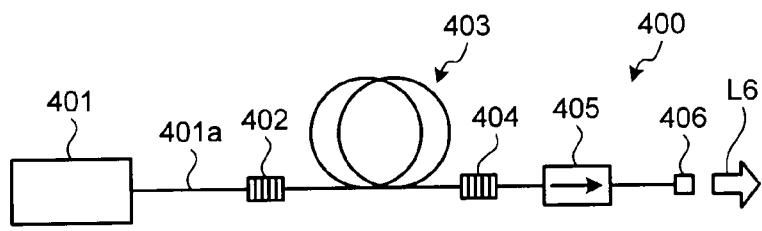
FIG. 9 is a schematic configuration diagram of an optical fiber laser according to a fifth embodiment.

As a fifth embodiment according to the present invention, an optical fiber laser is explained below, which is a light source device using the surface emitting laser array element according to the present invention as an excitation light source and using an amplification-purpose optical fiber as an optical amplification medium. FIG. 9 is a schematic configuration diagram of an optical fiber laser according to the fifth embodiment. As depicted in FIG. 5, an optical fiber laser 400 includes a surface emitting laser array package 401 that includes a multimode optical fiber 401a, an optical fiber grating 402, an amplification-purpose optical fiber 403, an optical fiber grating 404, an optical isolator 405, and an optical output terminal 406. The elements are connected to each other in the order described above appropriately via a connective optical fiber.

The surface emitting laser array package 401 has a configuration in which the surface emitting laser element 312 is replaced with the surface emitting laser device including the surface emitting laser array element unit as depicted in FIG. 5, the lens 323 is replaced with a group of lenses that are a combination of a micro lens array and a condenser lens, and the optical fiber 322 is a multimode optical fiber 401a, in the surface emitting laser package 300 depicted in FIG. 7. A surface of the micro lens array is micro-processed into a form in which small collimate lenses are arranged in a two-dimensional array, and configured to collimate each laser beam emitted by each of surface emitting laser elements of the surface emitting laser array element to a collimated beam. The condenser lens is, for example, a convex lens that is spherical or aspherical, and is configured to condense laser beams collimated by the micro lens array, and to couple the condensed laser beams optically to the multimode optical fiber.

The amplification-purpose optical fiber 403 is a double cladding fiber in which ytterbium (Yb) ions, which are a rare-earth element and have an optical amplification effect, are added to the core. The optical fiber gratings 402 and 404 are configured to reflect an emission wavelength of Yb, for example a light in the vicinity of 1064 nm selectively with a certain reflectivity, and form an optical cavity. The optical isolator 405 has a function of transmitting light in one direction only and blocking light in the opposite direction. The optical output terminal 406 is, for example, an optical connector.

Operations of the optical fiber laser 400 are explained below. The surface emitting laser array package 401 optically couples a leaser beam emitted from each of the surface emitting laser elements supplied with a current from an external control circuit to the multimode optical fiber 401a by the group of lenses, and emits it as an excitation light. The excitation light is synthesized from laser beams emitted from a plurality of surface emitting laser elements, and its light intensity is very high. The wavelength of a laser beam to be emitted by each of the surface emitting laser elements is set to, for example around 915 nm, in order to excite the amplification-purpose optical fiber 403 to which Yb has been added. For this reason, each of the surface emitting laser elements uses an active layer made of an InGaAs-type material.

The excitation light emitted from the multimode optical fiber 401a passes through the optical fiber grating 402, and is input into the amplification-purpose optical fiber 403. Yb ions emit light in the amplification-purpose optical fiber 403 into which the excitation light has been input, and laser oscillation occurs based on this emission due to an optical amplification action of the amplification-purpose optical fiber 403 and an action of the optical fiber gratings 402 and 404 as a cavity, so that a laser beam L6 of a wavelength around 1064 nm passes through the optical isolator 405, and is output from the optical output terminal 406. Light in the opposite direction is blocked by the optical isolator 405, and thus the optical fiber laser 400 operates stably.

Because in the optical fiber laser 400, the surface emitting laser element having a low thermal impedance and low dislocation according to the present invention is used, the optical fiber laser 400 achieves high reliability, high heat radiating ability, and low cost. Moreover, because the surface emitting laser element having high stability of emission wavelength is used, an amplification state of the amplification-purpose optical fiber 403 becomes stable, and the output of the laser beam L6 also becomes stable.

Although according to the fifth embodiment, the surface emitting laser array element is used as an excitation light source, the excitation light source may be a single surface emitting laser element instead. Moreover, according to the fifth embodiment, an amplification-purpose optical fiber is used as an optical amplification medium, but a solid-state laser device may be configured using a YAG crystal, an YLF crystal, or the like as an optical amplification medium.

(Sixth Embodiment)

Figure 10:
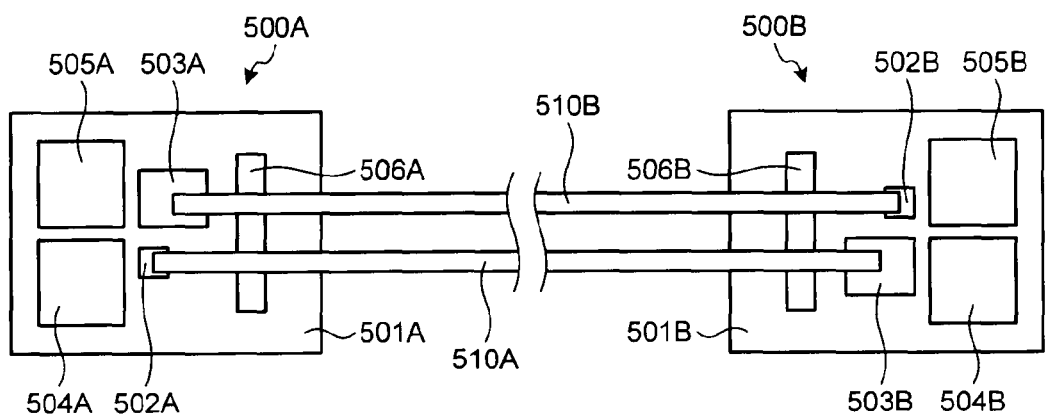
FIG. 10 is a schematic plan view illustrating a state in which two optical transmitting-receiving modules according to a sixth embodiment are connected to each other via two optical waveguides.

The surface emitting laser element and the surface emitting laser array element according to the present invention may form various optical modules by combining them with an optical waveguide. As a sixth embodiment according to the present invention, an optical transmitting-receiving module is explained below, which is an optical module using the surface emitting laser element according to the present invention. FIG. 10 is a schematic plan view that depicts a state in which two optical transmitting-receiving modules 500A and 500B according to the sixth embodiment are connected to each other via two optical waveguides 510A and 510B. In FIG. 10, the optical transmitting-receiving module 500A includes a holding member 501A and respective elements provided on the holding member 501A, which are: a spacer 506A on which the optical waveguides 510A and 510B such as optical fibers are mounted and which is configured to perform positioning of these; a surface emitting laser element 502A according to the present invention that transmits an optical signal via the optical waveguide 510A; a light receiving element 503A that receives an optical signal transmitted via the optical waveguide 510B and converts the received signal into an electric signal; a drive circuit 504A that controls an emission state of the surface emitting laser element 502A; and an amplifier circuit 505A that amplifies an electric signal converted by the light receiving element 503A. Emission by the surface emitting laser element 502A is controlled via the drive circuit 504A by a control signal from an external control unit (not illustrated). An electric signal converted by the light receiving element 503A is transmitted to the control unit via the amplifier circuit 505A. To avoid complication, illustration of wire bonding between the drive circuit 504A and the surface emitting laser element 502A, and wire bonding between the amplifier circuit 505A and the light receiving element 503A are omitted.

The optical transmitting-receiving module 500B has a configuration similar to that of the optical transmitting-receiving module 500A; however, a structure related to transmission and a structure related to reception of the optical transmitting-receiving module 500A are interchanged for the optical transmitting-receiving module 500B. That is, the optical transmitting-receiving module 500B includes a holding member 501B and respective elements provided on the holding member 501B, which are: a spacer 506B for positioning the optical waveguides 510A and 510B; a surface emitting laser element 502B according to the present invention that transmits an optical signal via the optical waveguide 510B; a light receiving element 503B that receives an optical signal transmitted via the optical waveguide 510A and converts the received signal into an electric signal; a drive circuit 504B that controls an emission state of the surface emitting laser element 502B; and an amplifier circuit 505B that amplifies an electric signal converted by the light receiving element 503B. Emission by the surface emitting laser element 502B is controlled via the drive circuit 504B by a control signal from an external control unit (not illustrated). An electric signal converted by the light receiving element 503B is transmitted to the control unit via the amplifier circuit 505B.

In the optical transmitting-receiving modules 500A and 500B, because the surface emitting laser elements 502A and 502B according to the present invention, which have low thermal impedances and low dislocation, are used respectively, high reliability, good high-frequency modulation characteristics, high stability of emission wavelength, and high heat radiating ability are achieved.

Optical coupling portions between the surface emitting laser elements 502A and 502B and the optical waveguides 510A and 510B in the optical transmitting-receiving modules 500A and 500B depicted in FIG. 10 are specifically explained below. Although an optical coupling portion is explained below using the optical transmitting-receiving module 500A, and the surface emitting laser element 502A, and the optical waveguide 510A, the optical coupling portion for them may be applied to a combination of the optical transmitting-receiving module 500B, the surface emitting laser element 502B, and the optical waveguide 510B.

Figure 11:
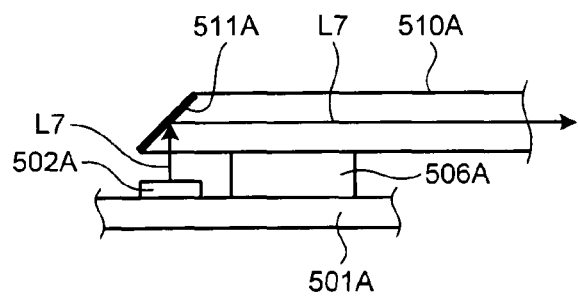
FIG. 11 is a side view illustrating an example of an optical coupling portion between a surface emitting laser element and an optical waveguide in the optical transmitting-receiving module depicted in FIG. 10.

At first, FIG. 11 is a side view of an example of an optical coupling portion between the surface emitting laser element 502A and the optical waveguide 510A in the optical transmitting-receiving module 500A depicted in FIG. 10. As depicted in FIG. 11, an end face of the optical waveguide 510A is processed so as to incline by approximately 45 degrees with respect to its optical axis, and a reflective film 511A as an optical coupling unit is formed on the end face and has a mirror-like finishing. Relative positions of the surface emitting laser element 502A and the reflective film 511A are positioned by the spacer 506A, and they are adjusted so that the surface emitting laser element 502A is to be positioned under the reflective film 511A. An optical signal L7 emitted from the surface emitting laser element 502A is reflected by the reflective film 511A and is coupled to the optical waveguide 510A, and then propagates inside of the optical waveguide 510A.

Figure 12:
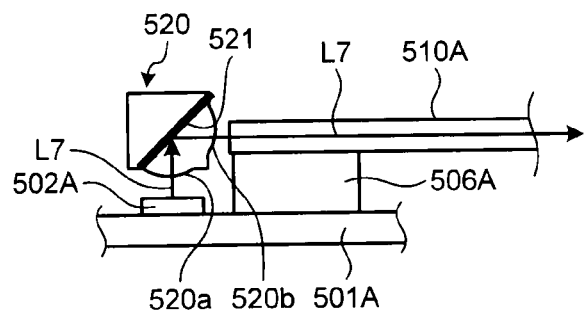
FIG. 12 is a side view illustrating another example of the optical coupling portion between the surface emitting laser element and the optical waveguide.

FIG. 12 is a side view of another example of an optical coupling portion between the surface emitting laser element 502A and the optical waveguide 510A. In the example depicted in FIG. 12, a mirror assembly 520 is provided as an optical coupling unit above the surface emitting laser element 502A and on a lateral side of an end face of the optical waveguide 510A. The mirror assembly 520 includes an incident surface 520a opposite to the surface emitting laser element 502A and an outgoing surface 520b opposite to the end surface of the optical waveguide 510A, and is provided with a reflective surface 521 inside. The optical signal L7 emitted from the surface emitting laser element 502A is input into the mirror assembly 520 from the incident surface 520a, reflected by the reflective surface 521, emitted from the outgoing surface 520b, and coupled to an end face of the optical waveguide 510A, and propagates inside the optical waveguide 510A. A micro lens (array) for collimating or condensing may be provided to the incident surface 520a and/or the outgoing surface 520b of the mirror assembly 520.

Figure 13:
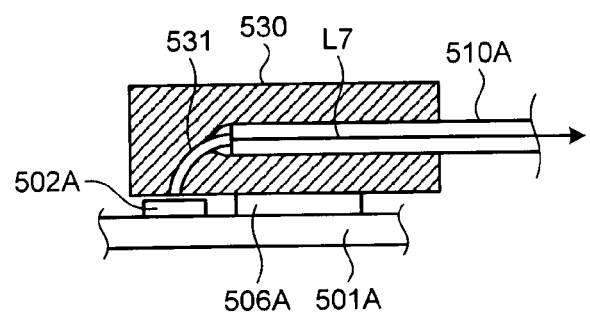
FIG. 13 is a partial cross-sectional side view illustrating still another example of the optical coupling portion between the surface emitting laser element and the optical waveguide.

FIG. 13 is a partial cross-sectional side view of still another example of an optical coupling portion between the surface emitting laser element 502A and the optical waveguide 510A. According to the example depicted in FIG. 13, the optical waveguide 510A that is an optical fiber is held in a connector housing 530 mounted on the spacer 506A, and furthermore, an optical fiber core wire 531, which is an optical coupling portion, is smoothly curved, and one of its end faces is connected to the optical waveguide 510A, while the other end face is held so as to face the surface emitting laser element 502A. The optical signal L7 emitted from the surface emitting laser element 502A is input from the end face of the optical fiber core wire 531, propagates through the optical fiber core wire 531, and then is coupled to and propagates inside the optical waveguide 510A.

Figure 14:
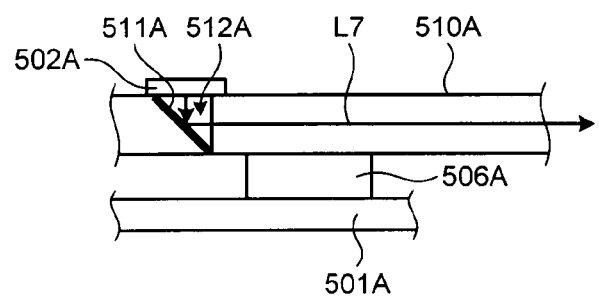
FIG. 14 is a side view of still another example of the optical coupling portion between the surface emitting laser element and the optical waveguide.

FIG. 14 is a side view of still another example of an optical coupling portion between the surface emitting laser element 502A and the optical waveguide 510A. According to the example depicted in FIG. 14, a groove 512A that is wedge-shaped and has an inclined internal face inclined by approximately 45 degrees with respect to the optical axis is formed in the optical waveguide 510A mounted on the spacer 506A. The reflective film 511A is also formed on the inclined internal face and has a mirror-like finishing. The groove 512A and the reflective film 511A form an optical coupling unit. The surface emitting laser element 502A is directly mounted on the optical waveguide 510A at a position above the groove 512A. The surface emitting laser element 502A is configured to emit the optical signal L7 toward the substrate side, i.e., downward. The optical signal L7 emitted from the surface emitting laser element 502A is reflected by the reflective film 511A formed on the inclined internal face of the groove 512A and coupled to the optical waveguide 510A, and then propagates inside the optical waveguide 510A.

(Seventh Embodiment)

Figure 15:
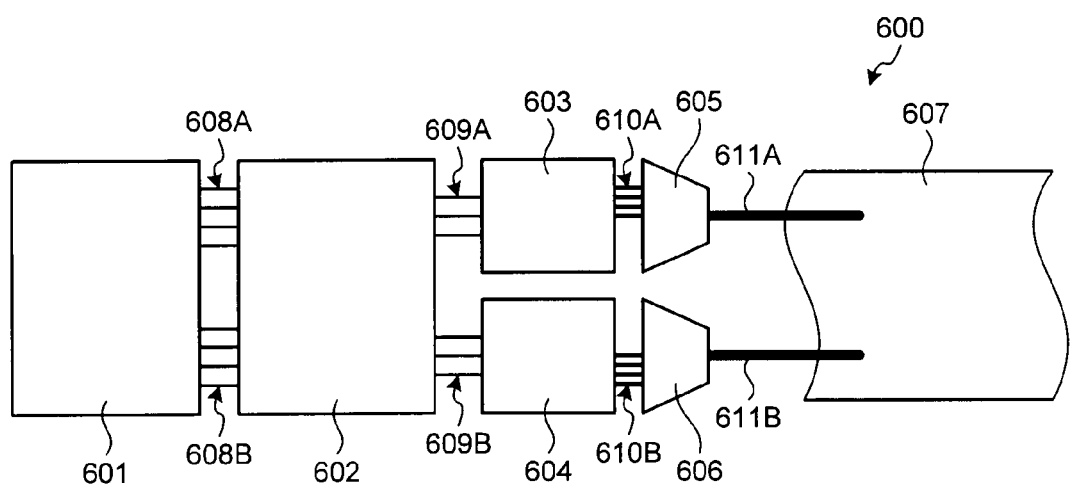
FIG. 15 is a schematic configuration diagram of a wavelength multiplex transmission system according to a seventh embodiment.

As a seventh embodiment according to the present invention, an optical communication system is explained below, which uses the surface emitting laser element and the surface emitting laser array element according to the present invention. FIG. 15 is a schematic configuration diagram of a wavelength multiplex transmission system according to the seventh embodiment. As depicted in FIG. 15, a wavelength multiplex transmission system 600 includes a signal creation processing unit 601, which may be a computer, a board, or a chip; a communication control circuit 602 connected to the signal creation processing unit 601 with electric wirings 608A and 608B, and including a CPU, an MPU, a wavelength control circuit, and the like; a surface emitting laser array element 603 and a light receiving element integration unit 604 that are connected to the communication control circuit 602 with electric wirings 609A and 609B, respectively; an optical wavelength multiplexer 605 connected to the surface emitting laser array element 603 with an optical fiber array 610A; an optical wavelength demultiplexer 606 connected to the light receiving element integration unit 604 with an optical fiber array 610B; and a communication target 607, which may be a network, a PC, a board, a chip, or the like, connected to the optical wavelength multiplexer 605 and the optical wavelength demultiplexer 606 with single optical fibers 611A and 611B, respectively. In the surface emitting laser array element 603, surface emitting laser elements according to the present invention with different emission wavelengths are arranged one-dimensionally or two-dimensionally.

Operations of the wavelength multiplex transmission system 600 are explained below. The signal creation processing unit 601 creates an electric signal to be transmitted to the communication subject 607, and transmits the created signal to the communication control circuit 602 via the electric wiring 608A. The communication control circuit 602 gives a drive current to the surface emitting laser array element 603 via the electric wiring 609A, and generates an optical signal by giving a different signal to each of the surface emitting laser elements forming the surface emitting laser array element 603. Each of the optical fibers forming the optical fiber array 610A is optically coupled to each of the surface emitting laser elements forming the surface emitting laser array element 603, and transmits each generated optical signal to the optical wavelength multiplexer 605 signal beam by signal beam through a different optical fiber. The optical wavelength multiplexer 605 performs wavelength-multiplexing on transmitted optical signals, and couples them to the single optical fiber 611A. The optical fiber 611A transmits a wavelength-multiplexed optical signal to the communication target 607.

The optical wavelength demultiplexer 606 demultiplexes the wavelength-multiplexed optical signal that is transmitted from the communication target 607 via the optical fiber 611B per wavelength, and couples each signal to each of the optical fibers forming the optical fiber array 610B. The optical fiber array 610B transmits each optical signal to the light receiving element integration unit 604. Each of the light receiving elements forming the light receiving element integration unit 604 is optically coupled to each of the optical fibers forming the optical fiber array 610B, receives each optical signal and converts it into an electric signal, and transmits each electric signal to the communication control circuit 602 via the electric wiring 609B. The communication control circuit 602 transmits each electric signal to the signal creation processing unit 601 via the electric wiring 608B. The signal creation processing unit 601 performs signal processing of each signal.

In the wavelength multiplex transmission system 600, because the surface emitting laser array element 603 according to the present invention having a low thermal impedance, low dislocation, and high stability of emission wavelength is used, wavelength multiplex transmission of a large volume at a high density is achieved with high reliability. Moreover, since each optical signal from each of the surface emitting laser elements of the surface emitting laser array element 603 is coupled to the single optical fiber 611A by the optical wavelength multiplexer 605, it is possible to achieve a large volume of signal transmission at a high throughput with a single fiber.

Depending on its use, in a configuration of the wavelength multiplex transmission system 600, a parallel transmission system may be employed in which the surface emitting laser array element 603 and the light receiving element integration unit 604 are directly connected to the communication target 607 by the optical fiber arrays. In this case, since the surface emitting laser array element 603 according to the present invention has a stable mode, and each emission wavelength is stable, construction of a parallel transmission system having a plurality of light sources with high reliability becomes easy. Furthermore, the surface emitting laser array element according to the present invention has good high-frequency modulation characteristics, and thus achieves long distance communications exceeding 10 km at a transmission speed higher than 50 Gbit/s.

As described above, the surface emitting laser element, the surface emitting laser array element, the surface emitting laser device, the light source device, and the optical module according to the present invention are each suitable to be applied to a light source for various optical communications, such as optical interconnections.

Further effects and modifications will be readily derived by one skilled in the art. Thus, embodiments of the present invention of a wider scope are not to be limited to the above expressed and described particular details and representative embodiments. Therefore, various modifications are possible without departing from the spirit or scope of the overall concept of the present invention defined by the appended claims and their equivalents.

What is claimed is:

1. A surface emitting laser element, comprising:
   a substrate made of GaAs;
   a lower multilayer film reflecting mirror formed on the substrate and formed of a periodic structure of a low-refractive-index layer made of $Al_xGa_{1-x}As$, where $0.8 \leq x \leq 1$, and a high-refractive-index layer formed of $Al_yGa_{1-y}As$, where $0 \leq y \leq x$, at least one of the low-refractive-index layer and the high-refractive-index layer being of n-type;
   an upper multilayer film reflecting mirror provided above the lower multilayer film reflecting mirror, and formed of a periodic structure of a low-refractive-index layer and a high-refractive-index layer;
   an active layer provided between the lower multilayer film reflecting mirror and the upper multilayer film reflecting mirror; and
   a lower electrode provided at least between the lower multilayer film reflecting mirror and the active layer, and configured to inject an electric current into the active layer,
   wherein
   the lower multilayer film reflecting mirror is added with an n-type dopant, and
   a warp of the substrate is equal to or more than a warp of $\delta$ in μm defined by equation (1) below, where $x_{ave}$ denotes an average Al composition in the lower multilayer film reflecting mirror, $n_{ave}$ in cm$^{-3}$ denotes an average addition concentration of the n-type dopant, d in μm denotes a thickness of the substrate, D in inches denotes a length of a longest one of lines each extending from one of vertexes of the substrate through a center of gravity of the substrate to an edge of the substrate:

$$\delta = 1.71 \times 10^6 \lambda \times [(1.39 \times 10^{-3})x_{ave} - (1.28 \times 10^{-23})n_{ave}] \times \left(\frac{D}{d}\right)^2. \quad (1)$$

2. The surface emitting laser element according to claim 1, wherein the low-refractive-index layer of the lower multilayer film reflecting mirror includes $Al_xGa_{1-x}As$, where $0.855 < x$.

3. The surface emitting laser element according to claim 1, wherein an average n-type carrier concentration in the lower multilayer film reflecting mirror is equal to or higher than $5 \times 10^{17}$ cm$^{-3}$.

4. The surface emitting laser element according to claim 1, wherein in the lower multilayer film reflecting mirror, at least the low-refractive-index layer is of the n-type, and the high-refractive-index layer has a lower carrier concentration than the low-refractive-index layer.

5. The surface emitting laser element according to claim 1, wherein the lower multilayer film reflecting mirror is added with an n-type dopant that is at least one of Si, Te, S, Se, Sn, and Ge.

6. The surface emitting laser element according to claim 1, wherein the substrate and the lower electrode are electrically separated.

7. A surface emitting laser array element, comprising the surface emitting laser elements according to claim 1 that are arranged one-dimensionally or two-dimensionally.

8. A light source device, comprising:
an optical amplification medium; and
an excitation light source including the surface emitting laser element according to claim 1, and configured to excite the optical amplification medium.

9. A light source device, comprising:
an optical amplification medium; and
an excitation light source including the surface emitting laser array element according to claim 7, and configured to excite the optical amplification medium.

10. An optical module, comprising:
the surface emitting laser element according to claim 1;
an optical waveguide that propagates a laser beam emitted by the surface emitting laser element; and
an optical coupling unit configured to couple the laser beam to the optical waveguide.

11. An optical module, comprising:
the surface emitting laser array element according to claim 7;
an optical waveguide that propagates a laser beam emitted by the surface emitting array laser element; and
an optical coupling unit configured to couple the laser beam to the optical waveguide.

* * * * *